United States Patent
Simmonds

(10) Patent No.: US 9,117,651 B2
(45) Date of Patent: Aug. 25, 2015

(54) TRANSMIT/RECEIVE SWITCH WITH SERIES, DOUBLY-FLOATING DEVICE AND SWITCHED BIAS VOLTAGE

(71) Applicant: David Simmonds, Poway, CA (US)

(72) Inventor: David Simmonds, Poway, CA (US)

(73) Assignee: ViXS Systems, Inc., Toronto, Ontario (CA)

( * ) Notice: Subject to any disclaimer, the term of this patent is extended or adjusted under 35 U.S.C. 154(b) by 173 days.

(21) Appl. No.: 13/625,909

(22) Filed: Sep. 25, 2012

(65) Prior Publication Data
US 2014/0084997 A1   Mar. 27, 2014

(51) Int. Cl.
*H04B 1/44* (2006.01)
*H01L 25/00* (2006.01)

(52) U.S. Cl.
CPC .................................... *H01L 25/00* (2013.01)

(58) Field of Classification Search
CPC .............. H04B 1/48; H04B 1/44; H04B 1/18; H04B 1/406; H04B 1/525; H04B 1/54; H04B 1/28; H04B 1/30
USPC .............................. 455/77, 78, 88, 334, 550.1
See application file for complete search history.

(56) References Cited

U.S. PATENT DOCUMENTS

| | | | | |
|---|---|---|---|---|
| 6,108,526 | A * | 8/2000 | van der Plas | 455/78 |
| 8,301,186 | B2 * | 10/2012 | Gorbachov | 455/550.1 |
| 2005/0156621 | A1 * | 7/2005 | Dubey | 326/12 |

OTHER PUBLICATIONS

Huang, F., "A 0.5-μm CMOS T/R Switch for 900-MHz Wireless Applications," IEEE Journal of Solid-State Circuits, vol. 36, No. 3, Mar. 2001, pp. 486-492.
Poh, A. and Zhang Y., "Design and Analysis of Transmit/Receive Switch in Triple-Well CMOS for MIMO Wireless Systems," IEEE Transactions on Microwave Theory and Techniques, vol. 55, No. 3, Mar. 2007, pp. 458-466.
Li, Q. and Zhang, Y.P., "CMOS T/R Switch Design: Towards Ultra-Wideband and Higher Frequency," IEEE Journal of Solid-State Circuits, vol. 42, No. 3, Mar. 2007, pp. 563-570.

* cited by examiner

*Primary Examiner* — Nhan Le
(74) *Attorney, Agent, or Firm* — Abel Law Group, LLP

(57) ABSTRACT

An integrated circuit includes a node coupled between a terminal of the integrated circuit and a transmitter circuit. The integrated circuit includes a switch circuit coupled between the node and a receiver circuit. The switch circuit includes a bias circuit coupled to the node. The bias circuit is configured to provide a first bias voltage to the node in response to an indication of a transmit mode of the terminal. The bias circuit is configured to provide a second bias voltage to the node in response to an indication of a receive mode of the terminal. The switch circuit may include a plurality of n-type devices coupled in series. Each of the plurality of n-type devices may include a triple-well, doubly-floating n-type device. The plurality of n-type devices may include a resistively-biased bulk terminal and a resistively-biased n-well.

20 Claims, 4 Drawing Sheets

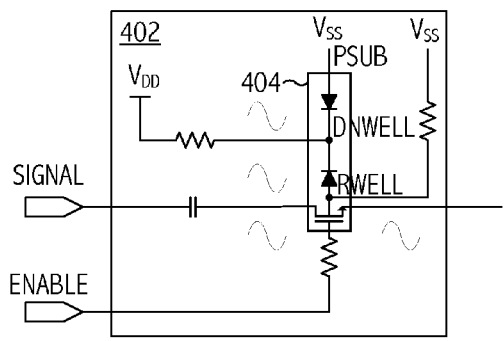
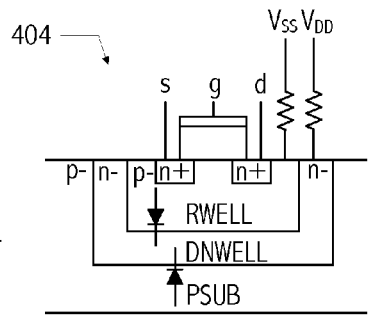
FIG. 4A　　　　　　　　FIG. 4B
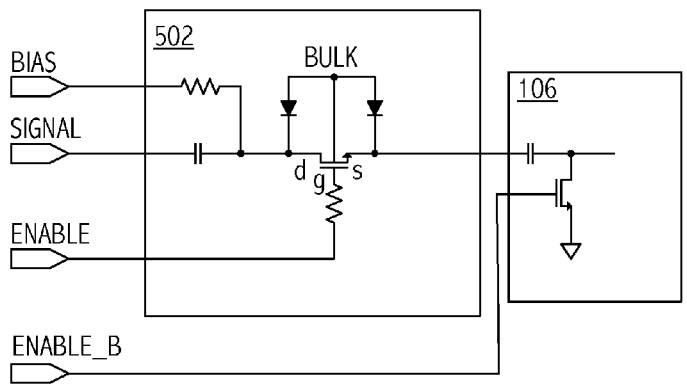
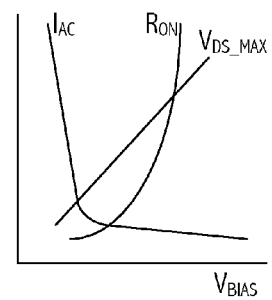
FIG. 5A　　　　　　　　FIG. 5B

TRANSMIT/RECEIVE SWITCH WITH SERIES, DOUBLY-FLOATING DEVICE AND SWITCHED BIAS VOLTAGE

BACKGROUND

1. Field of the Invention

This application is related to communications systems and more particularly to integrated circuit transceivers of communications systems.

2. Description of the Related Art

In general, a transceiver is a device that includes both a transmitter and a receiver in a single housing. In a typical transceiver application, power levels of transmitted signals are substantially greater than power levels of received signals at the transceiver terminal(s). Transmit power amplifier circuits are designed to handle relatively large voltage swings. In contrast, typical receiver circuits are designed to accept lower-power signal levels and a substantial amount of the input voltage is applied across gate-source terminals of devices of the receiver circuit. If the transmitter applies a high-voltage transmit signal to a shared transmit/receive terminal connected to a transmitter power amplifier and a receiver amplifier, those high voltage transmit signals will be applied across the gate-source terminals of devices in the receiver circuits and may damage those receiver input devices.

To reduce or eliminate damage to the receiver circuit from high-voltage transmit signals, a typical transceiver includes a transmit/receive switch that selects whether a transmit path or a receive path is operatively coupled to the terminal. The switch may be included as part of the integrated circuit transceiver or external to the integrated circuit transceiver. Implementations of a transmit/receive switch in series with a transmitter power amplifier can result in significant resistive power loss or the switch itself may be susceptible to damage from high voltage transmit signals. Implementations of a transmit/receive selector switch in series only with a receiver path (e.g., low-noise amplifier) may be better-tolerated by the system, but also may increase a noise figure of the system. To be well-tolerated by the system, a transmit/receive switch coupled in series with a receiver path should introduce only relatively low losses and relatively low capacitance, while being able to handle large voltage swings at its input.

In some applications, e.g., a Multimedia over Coax, (MoCA) application, signals may have high peak-to-average signal ratios, e.g., worst-case voltage swings of approximately 0V to two times the supply voltage ($2 \times V_{DD}$), although average voltages are substantially lower. Conventional techniques used to implement a low-loss, high-voltage switch are insufficient to handle large peak voltages that result from signals having high peak-to-average signal ratios. Accordingly, new techniques for implementing a transmit/receive switch are desired.

SUMMARY OF EMBODIMENTS OF THE INVENTION

In at least one embodiment of the invention, an integrated circuit includes a node coupled between a terminal of the integrated circuit and a transmitter circuit. The integrated circuit includes a switch circuit coupled between the node and a receiver circuit. The switch circuit includes a bias circuit coupled to the node. The bias circuit is configured to provide a first bias voltage to the node in response to an indication of a transmit mode of the terminal. The bias circuit is configured to provide a second bias voltage to the node in response to an indication of a receive mode of the terminal. The switch circuit may include a plurality of n-type devices coupled in series. Each of the plurality of n-type devices may include a triple-well, doubly-floating n-type device. The plurality of n-type devices may include a resistively-biased bulk terminal and a resistively-biased n-well.

In at least one embodiment of the invention, a method includes providing a first bias voltage to a node coupled between a terminal of an integrated circuit and a transmitter circuit of the integrated circuit in response to an indication of a transmit mode of the terminal. The method includes providing a second bias voltage to the node and coupling the terminal to a receive circuit of the integrated circuit in response to an indication of a receive mode of the terminal. The coupling of the terminal to the receive circuit may include resistively biasing a bulk terminal and resistively biasing a deep n-well terminal of each of a plurality of triple-well, n-type devices coupled in series. The method may include dividing a receive voltage across a plurality of triple-well, n-type devices.

BRIEF DESCRIPTION OF THE DRAWINGS

The present invention may be better understood by, and its numerous objects, features, and advantages made apparent to, those skilled in the art by referencing the accompanying drawings.

FIG. 4A illustrates a circuit diagram of an exemplary switch in a receiver path internal to a transceiver integrated circuit.

FIG. 4B illustrates a simplified cross-sectional view of device 404 of the switch of FIG. 4A.

FIG. 5A illustrates a circuit diagram of an exemplary switch in a receiver path internal to a transceiver integrated circuit.

FIG. 5B illustrates a waveform for the switch of FIG. 5A.

The use of the same reference symbols in different drawings indicates similar or identical items.

DETAILED DESCRIPTION

Figure 1A:
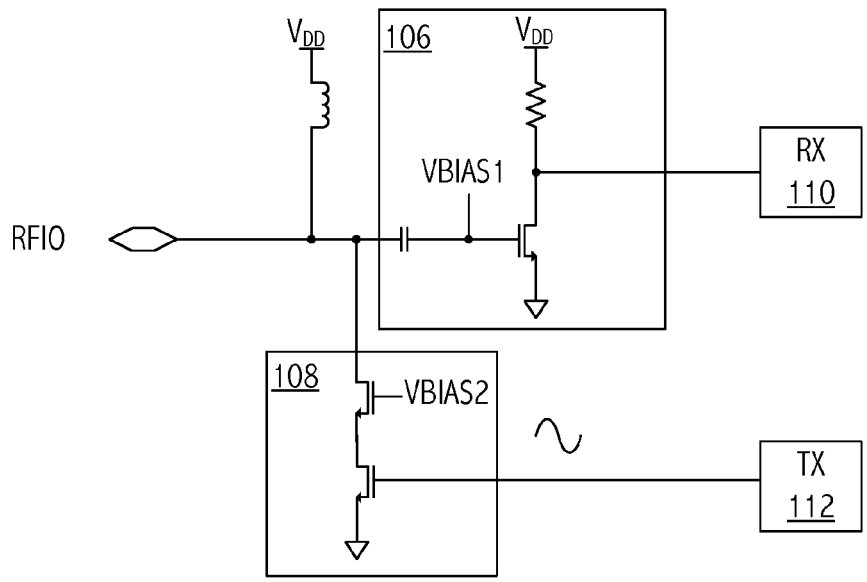
FIG. 1A illustrates a simplified circuit diagram of a conventional low-noise amplifier circuit and a conventional power amplifier circuit of a transceiver integrated circuit.
Figure 1B:
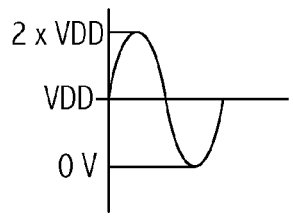
FIG. 1B illustrates a voltage waveform for the exemplary power amplifier of FIG. 2A.

Referring to FIG. 1A, a typical transceiver includes a transmitter including power amplifier 108 coupled to transmitter path 112 and a receiver including low-noise amplifier 106 coupled to receiver path 110. Power amplifier 108 is designed to handle relatively large voltage swings by using cascoded (i.e., series) devices to divide a voltage across multiple (e.g., two) devices. In contrast, low-noise amplifier 106 is designed to accept lower-power signal levels and a substantial amount of the input voltage will appear across gate-source terminals. If that input voltage is high enough, it will damage low-noise amplifier 106. Power amplifier 108 and low-noise amplifier 106 can be directly coupled to one or more package terminals (e.g., pins) when power amplifier 108 is a low-power amplifier. Referring to FIGS. 1A and 1B, power amplifier 108 may generate signals having a large voltage swing (e.g., $0V \leq V \leq 2 \times V_{DD}$) that may exceed the gate-to-source breakdown voltage associated with low-noise amplifier 106. In such applications where power amplifier 108 is designed to generate high-power signals, a transmit/receive switch must be included between the channel and the transmit path and/or the channel and the receive path to prevent damage to low-noise amplifier 106. Although simplified circuit implementations for power amplifier 108 and low-noise amplifier 106 are illustrated in FIG. 1A, those amplifiers may have any suitable circuit architectures.

Figure 2A:
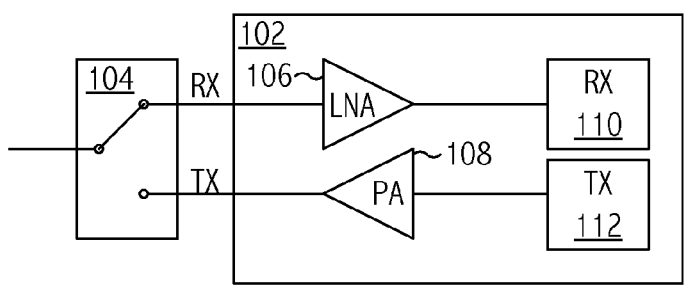
FIG. 2A illustrates a functional block diagram of a transmit/receive switch external to a transceiver integrated circuit.

A transmit/receive switch may be implemented external to an integrated circuit transceiver. Referring to FIG. 2A, switch 104 may be a single-pole, double-throw switch coupled to a transmit terminal of integrated circuit 102 and coupled to a receive terminal of integrated circuit 102. The external transmit/receive switch may be implemented in a different manufacturing technology than integrated circuit 102 to achieve a particular performance specification that may be difficult or impossible to achieve using the manufacturing process of integrated circuit 102. For example, integrated circuit 102 may be manufactured using complementary metal-oxide-semiconductor (CMOS) or BiCMOS manufacturing process and switch 104 may be manufactured using a gallium arsenide or microelectromechanical system (MEMS) manufacturing process. However, implementations using an external transmit/receive switch requires use of additional control terminals on the transceiver integrated circuit, introduces additional parts cost, and increases the area of a printed circuit board including the transmit/receive switch and the transceiver, and thus can be more expensive than use of a transmit/receive switch that is integrated with the transceiver on one integrated circuit die.

Figure 2B:
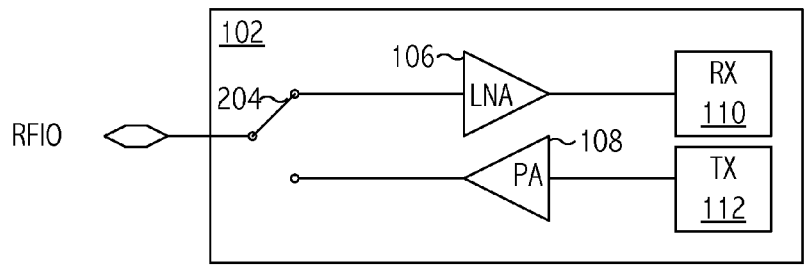
FIG. 2B illustrates a functional block diagram of a single-pole, double-throw transmit/receive switch internal to a transceiver integrated circuit.
Figure 2C:
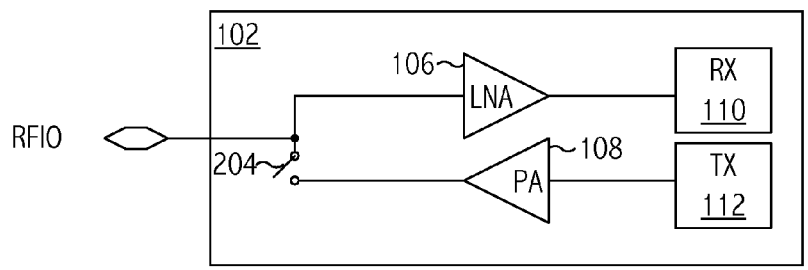
FIG. 2C illustrates a functional block diagram of a switch in series with a transmit path internal to a transceiver integrated circuit.
Figure 2D:
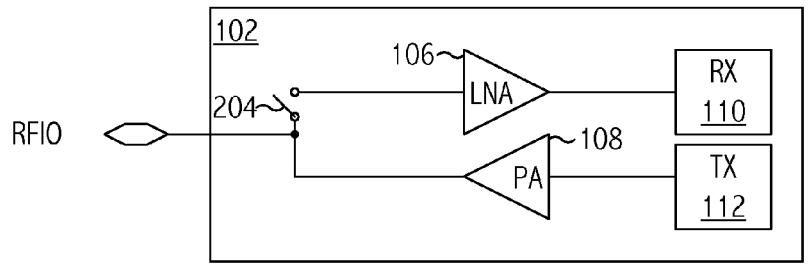
FIG. 2D illustrates a functional block diagram of a switch in series with a receive path internal to a transceiver integrated circuit.

Referring to FIGS. 2B-2D, to reduce costs, a single input/output terminal of the transceiver, RFIO, is coupled to an internal transmit/receive switch. Switch 204 may be implemented as a single-pole, double-throw selector coupled to both of the transmitter path and the receiver path (FIG. 2B), an on/off switch in series with a transmitter path (FIG. 2C), or an on/off switch in series with a receiver path (FIG. 2D). A typical single-pole, double-throw selector is implemented using two switches, one in series with the transmitter path and one in series with the receiver path, and corresponding control logic. In general, switches in series with power amplifiers are difficult to implement in the integrated circuit transceiver without substantial resistive power loss or risk of high voltage damage to the switch itself. Implementing the transmit/receive switch in series with the low-noise amplifier of the receiver better tolerates the series resistance. However, a transmit/receive switch that is in series with a low-noise amplifier must have low loss and capacitance while being able to handle a large voltage swing at its input. In addition, in some applications, e.g., a Multimedia over Coax, (MoCA) application, the transmit/receive switch must be able to handle a large peak-to-average signal ratio.

Figure 3:
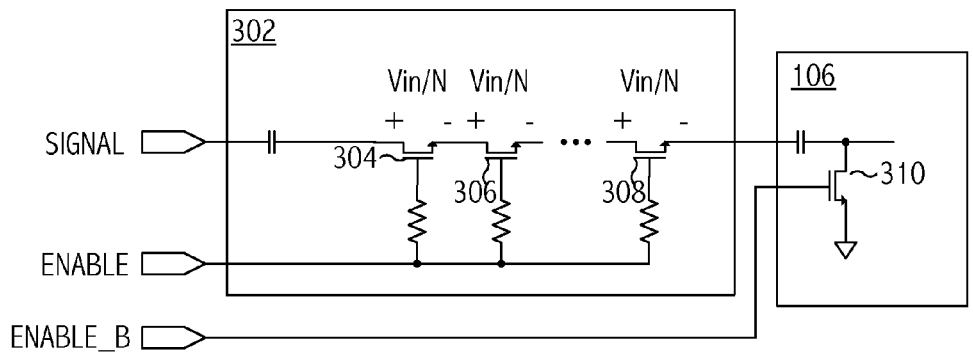
FIG. 3 illustrates an exemplary switch in a receiver path internal to a transceiver integrated circuit.

Referring to FIG. 3, transmit/receive switch has an increased voltage handling capability due to the inclusion of multiple switch devices coupled in series (e.g., devices 304, 306, and 308) as compared to a transmit/receive switch including only a single switch device. The series-coupled devices divide the input voltage across the series-coupled devices. If devices 304, 306, and 308 have substantially equivalent sizes (i.e., equal within design tolerances), then the input voltage divides substantially equally across each device (e.g., $V_{IN}/N$, where N is an integer greater than or equal to two). If devices 304, 306, and 308 have different sizes, the voltage divides according to a ratio based on the device sizes. However, an increase in the number of devices coupled in series increases resistive and capacitive losses of the switch. Accordingly, a transmit/receive switch design trades off voltage-handling capability with insertion loss. To reduce the transmit voltage incident on the low-noise amplifier device in transmit mode, power-down device 310, which may be included in low-noise amplifier 106, is enabled when switch 302 is disabled. When enabled, power-down device 310 reduces the AC voltage at the output of switch 302 to approximately zero.

Referring to FIGS. 4A and 4B, a technique for increasing voltage-handling and reducing loss in a transmit/receive switch includes a device formed using a typical triple-well CMOS process. A buried, deep n-well separates the body of the device from the common substrate. The triple-well device includes two p-n junction diodes. One p-n junction diode is formed between a p-well (RWELL) and a deep n-well (DNWELL). Another p-n junction diode is formed between the deep n-well (DWELL) and a p-substrate (PSUB). Those two junction diodes are maintained in reverse bias to prevent breakdown in isolation between the p-well, deep n-well, and p-substrate. The technique for increasing the voltage handling of a transmit/receive switch includes floating those wells for AC signals (i.e., RF floating those wells) by resistively biasing the bulk terminal and the deep n-well terminal using a high value resistances (e.g., 5 kilo-Ohms to 10 kilo-Ohms). RF Floating those wells so that they float for AC signals prevents a strong signal from turning on source-bulk and/or drain-bulk diodes which would otherwise clip the input signal. This technique may also be referred to as bootstrapping. RF floating the bulk bootstraps its voltage to the source and drain voltages. A similar effect occurs on the gate voltage when a control signal is fed to a gate terminal of the device via a high value resistor. The p-well is biased by a DC voltage (i.e., RF grounded). The device capacitances cause the bulk and n-well signal voltages to follow the input voltage, with some attenuation, thereby reducing the amplitude of the differential voltage between nodes.

Referring to FIG. 5A, another technique for increasing the voltage handling and reducing the loss of a transmit/receive switch includes using a device having a drain terminal responsive to a bias signal. The bias signal reverse-biases drain-to-bulk and source-to-bulk junctions, which reduces the junction capacitances of drain-to-bulk and source-to-bulk diodes and also prevents drain-to-bulk and source-to-bulk diodes from turning on at the falling edge of a large input signal. In at least one embodiment of switch 502, the voltage of the bias signal has an intermediate voltage level that is between zero volts and the power supply voltage ($0 V \leq V_{BIAS} \leq V_{DD}$).

Referring to FIG. 5B, the off-mode input AC current, $I_{AC}$, versus $V_{BIAS}$ decreases quickly as the drain bias voltage increases. However, increasing $V_{BIAS}$ linearly increases a maximum drain-to-source voltage, $V_{DS\_MAX}$, which increases the risk of overvoltage damage. Accordingly, selection of $V_{BIAS}$ balances off-mode loading with the risk of overvoltage damage. Setting the bias voltage to the same voltage level in both receive (i.e., switch on) mode and in transmit (i.e., switch off) mode causes a decrease in a gate-to-source voltage, thereby increasing the on-resistance of the switch, $R_{ON}$, and switch loss. Accordingly, the voltage level of the bias signal, $V_{BIAS}$, provided to the switch is switched between two different voltage levels. The bias signal has one voltage level in transmit mode and another voltage level in a receive mode. Exemplary voltage levels include $V_{DD}/3$ (e.g., 1 V) in transmit mode and 0 V in receive mode.

Figure 6:
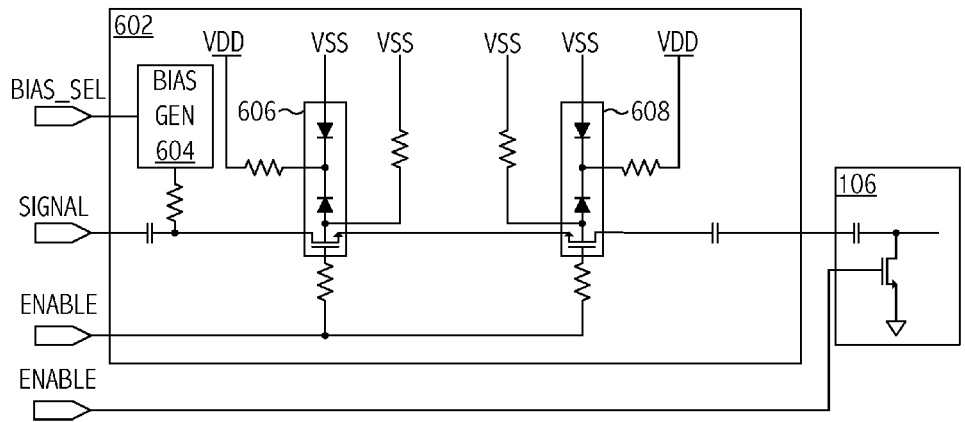
FIG. 6 illustrates a circuit diagram of an exemplary switch in a receiver path internal to a transceiver integrated circuit consistent with at least one embodiment of the invention.

Referring to FIG. 6, transmit/receive switch circuit 602 is coupled in a receive path of transceiver. Switch circuit 602 includes devices 606 and 608, which are two series-coupled, doubly-floating, triple-well, n-type devices. Devices 606 and 608 are formed using a high-voltage, input/output device manufacturing process technique (e.g., a technique for forming 3.3 V input/output transistor) and devices in low-noise amplifier 106 are formed using a low-voltage manufacturing technique (e.g., a technique for forming a 1.2 V core transistor). However, in other embodiments, devices 606 and 608 and low-noise amplifier 106 are formed using the same type of devices (e.g., 1.2V core transistors). Also note that although switch 602 includes two series-coupled, doubly-floating, triple-well, n-type devices, additional devices may be used. In general, additional devices in series reduce the risk of overvoltage damage, but increase loss. Accordingly, the fewest number of devices that can reduce the overvoltage and reduce loss are used. Device 606 receives a switched bias voltage, $V_{BIAS}$, at its drain terminal from bias generator 604. An exemplary $V_{BIAS}$ is approximately $V_{DD}/3$ (e.g., approximately 1 V) in transmit mode and approximately 0 V in receive mode. Switch circuit 602 may be configured as an internal transmit/receive switch in a receive path (e.g., configuration of FIG. 2D) or as part of a single-pole, double-throw transmit/receive switch of FIG. 2B.

Figure 7:
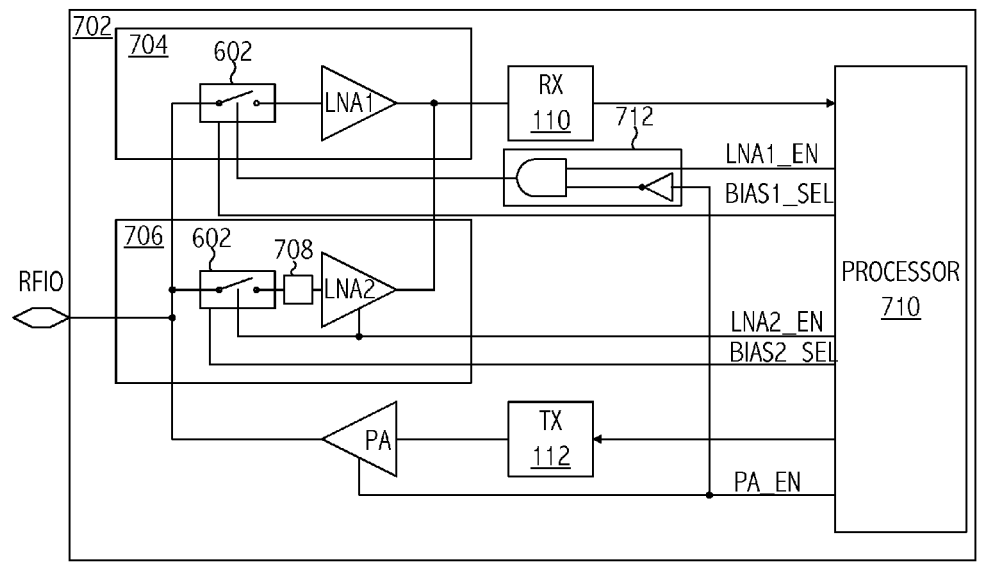
FIG. 7 illustrates a functional block diagram of an exemplary transceiver including switches in the receiver path internal to a transceiver integrated circuit consistent with at least one embodiment of the invention.

In at least one embodiment, a transceiver uses more than one gain mode to accommodate a wide range of input signal levels. A decreased gain mode is achieved by switching resistive pads at the input of the low-noise amplifier. However, introduction of additional components for switched pads increases the complexity and losses in a high-gain mode. To reduce or minimize those losses in a high-gain mode and to facilitate gain switching, transceiver 702 uses separate receive paths (e.g., separate low-noise amplifiers). Referring to FIG. 7, transceiver 702 includes a lower-loss input path 704 as compared to input path 706, which implements a lower-gain mode using attenuating device 708 (a resistive pad, a resistive voltage divider, a capacitive voltage divider, or other suitable attenuating devices) selectively coupled to LNA2 by a separate transmit/receive switch 602.

In at least one embodiment, transceiver 702 includes protection logic that reduces or eliminates the likelihood of overvoltage damage to devices in a low-noise amplifier from large voltages generated by a power amplifier from simultaneous operation of the power amplifier and the low-noise amplifier. For example, in testing and/or software development design phases or in a loopback calibration mode of transceiver 702, the high-gain input path may be damaged by a high output voltage generated by the power amplifier that may not affect the lower-gain input path since it is protected by an attenuating device. Accordingly, transceiver 702 includes control logic to prevent the simultaneous operation of the high-gain input path and the power amplifier. Note that control logic 712 is exemplary only, and other logic that opens the switch when the transmit path is enabled may be used. Thus, a low-loss, on-chip transmit/receive switch for selectively coupling a multi-directional terminal to a transmit path and a receive path in a transceiver application with a high peak-to-average signal ratio has been disclosed.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test, or fabrication stages. Structures and functionality presented as discrete components in the exemplary configurations may be implemented as a combined structure or component. Various embodiments of the invention are contemplated to include circuits, systems of circuits, related methods, and tangible computer-readable media having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described using single-ended circuits for a MoCA application, one of skill in the art will appreciate that the teachings herein can be utilized for other communications standards and/or using differential circuits which may have improved power-handling and noise immunity as compared to single-ended circuits. In addition, although the invention has been described for an n-type device manufactured using a triple-well CMOS technology, one of skill in the art will appreciate that the teachings herein can be utilized with other device types implemented using other manufacturing technologies. Variations and modifications of the embodiments disclosed herein may be made based on the description set forth herein without departing from the scope and spirit of the invention as set forth in the following claims.

What is claimed is:

1. An integrated circuit comprising:
   a node coupled between a terminal of the integrated circuit and a transmitter circuit;
   a switch circuit coupled between the node and a receiver circuit, the switch circuit comprising:
      a bias circuit coupled to the node, the bias circuit configured to provide a first bias voltage to the node in response to an indication of a transmit mode of the terminal and configured to provide a second bias voltage to the node in response to an indication of a receive mode of the terminal.

2. The integrated circuit, as recited in claim 1, wherein the switch circuit comprises:
   a plurality of n-type devices coupled in series between the node and the receiver circuit, each of the plurality of n-type devices comprising a triple-well, doubly-floating n-type device.

3. The integrated circuit, as recited in claim 2, wherein each of the plurality of n-type devices comprises a resistively-biased bulk terminal and a resistively-biased deep n-well.

4. The integrated circuit, as recited in claim 1, wherein the first bias voltage, $V_{BIAS1}$, is $0V < V_{BIAS1} < V_{DD}$, where $V_{DD}$ is a power supply voltage and the second bias voltage is approximately 0V.

5. The integrated circuit, as recited in claim 1, wherein the first bias voltage is approximately $V_{DD}/3$ and the second bias voltage is approximately 0V.

6. The integrated circuit, as recited in claim 1, further comprising:
a second switch circuit coupled between the node and a second receiver circuit, the receiver circuit providing a higher-gain path than a receiver path provided by the second receiver circuit.

7. The integrated circuit, as recited in claim 6, further comprising:
a resistive pad coupled between the second switch circuit and the second receiver circuit.

8. The integrated circuit, as recited in claim 6, wherein the receiver circuit and the second receiver circuit are coupled to a receiver path.

9. The integrated circuit, as recited in claim 8, wherein the receiver circuit is responsive to a first value of a control signal and the second receiver circuit is responsive to a second value of the control signal and the second value indicates a loopback mode or test mode of the apparatus.

10. The integrated circuit, as recited in claim 1, further comprising:
protection circuitry coupled to the switch circuit, the protection circuitry being configured to close the switch circuit in response to an indication of the transmitter circuit being disabled and an indication of the receiver circuit being enabled.

11. A method comprising:
providing a first bias voltage to a node coupled between a terminal of an integrated circuit and a transmitter amplifier circuit of the integrated circuit in response to an indication of a transmit mode of the terminal; and
providing a second bias voltage to the node and coupling the terminal to a receiver amplifier circuit of the integrated circuit in response to an indication of a receive mode of the terminal.

12. The method, as recited in claim 11, wherein the coupling the terminal to the receive circuit comprises:
resistively biasing a bulk terminal and resistively biasing a deep n-well terminal of each of a plurality of triple-well, n-type devices coupled in series between the node and the receive circuit.

13. The method, as recited in claim 11, further comprising:
dividing a voltage on the node across a plurality of triple-well, n-type devices.

14. The method, as recited in claim 11, wherein the first bias voltage is approximately $V_{DD}/3$ and the second bias voltage is approximately 0V.

15. The method, as recited in claim 11, further comprising:
selecting a high-gain path of a plurality of receiver paths in response to an indication of a first receiver mode.

16. The method, as recited in claim 15, wherein the indication is based on an indication that the transmit path is disabled and an indication of the high-gain path is enabled.

17. The method, as recited in claim 15, further comprising:
selecting a lower-gain path of the plurality of receiver paths in response to an indication of a loopback or test mode of the receiver; and
attenuating a received signal in response to the indication of the loopback or test mode of the integrated circuit.

18. An integrated circuit comprising:
a node coupled between a terminal of the integrated circuit and a transmitter amplifier circuit; and
means for selectively coupling the node to a receiver amplifier circuit and providing a first bias voltage to the node in response to an indication of a transmit mode of the terminal and providing a second bias voltage to the node in response to an indication of a receive mode of the terminal.

19. The integrated circuit, as recited in claim 18, wherein the means for selectively coupling resistively biases a bulk terminal and a deep n-well terminal of each of a plurality of series-coupled, triple-well, n-type devices of the means for selectively coupling.

20. The integrated circuit, as recited in claim 18, wherein the means for selectively coupling comprises means for dividing a receive voltage across a plurality of triple-well, n-type devices.

* * * * *